United States Patent [19]
Goesele et al.

[11] Patent Number: 5,206,523
[45] Date of Patent: Apr. 27, 1993

[54] MICROPOROUS CRYSTALLINE SILICON OF INCREASED BAND-GAP FOR SEMICONDUCTOR APPLICATIONS

[76] Inventors: Ulrich M. Goesele, 3008 Eubanks Rd., Durham, N.C. 27707; Volker E. Lehmann, Geyerspergerstr. 53, D-8 Munich 21, Fed. Rep. of Germany

[21] Appl. No.: 751,800

[22] Filed: Aug. 29, 1991

[51] Int. Cl.$^5$ .............................. H01L 27/14
[52] U.S. Cl. .................... 257/16; 257/21; 257/53; 257/56; 257/103; 257/73; 136/261; 136/258; 136/249; 136/254
[58] Field of Search .......... 357/30 J, 30 K, 4, 2, 357/59 C, 30 J, 30 K, 30 R, 59 B, 59 D, 60, 17, 16, 15; 136/249 TJ, 261, 258, 255, 258 PC

[56] References Cited

U.S. PATENT DOCUMENTS

| | | | |
|---|---|---|---|
| 4,155,781 | 5/1979 | Diepers | 136/261 |
| 4,392,011 | 7/1983 | Pankove et al. | 136/261 |
| 4,642,414 | 2/1987 | Rasch et al. | 357/30 J |
| 4,775,425 | 10/1988 | Guha et al. | 357/30 K |
| 4,914,044 | 4/1990 | Grabmaier et al. | 136/244 |
| 4,954,182 | 9/1990 | Ovshinsky et al. | 136/249 TJ |

FOREIGN PATENT DOCUMENTS

| | | | |
|---|---|---|---|
| 57-1265 | 1/1982 | Japan | 136/249 TJ |
| 57-153478 | 9/1982 | Japan | 136/249 TJ |

OTHER PUBLICATIONS

Lehmann et al., "Porous Silicon Formation: A Quantum Wire Effect", *Appl. Phys. Lett.* 58(8), Feb. 25, 1991, pp. 856-858.

Canham, "Silicon Quantum Wire Array Fabrication by Electrochemical and Chemical Dissolution of Wafers", *Appl. Phys. Lett.* 57(10), Sep. 3, 1990, pp. 1046-1048.

Moustakas et al., "Properties and Photovoltaic Applications of Microcrystalline Silicon Films Prepared by RF Reactive Sputtering," *J. Appl. Phys.* 58(2), Jul. 15, 1985, pp. 983-986.

Okaniwa et al., "Flexible Substrate Solar Cells", *JARECT*, vol. 6, Amorphous Semiconductor Technologies & Devices (1983), Hamakawa (ed.), Ohmsha Ltd., Japan and North-Holland Publishing Co., Holland.

Fang et al., "Combined Microcrystal and Amorphous Silicon Cells," *Appl. Phys. Lett.* 41(4), Aug. 15, 1982, pp. 365-366.

*Primary Examiner*—William Mintel

[57] ABSTRACT

A process is disclosed for producing microporous crystalline silicon which has a band-gap substantially increased relative to that of normal crystalline silicon. This process involves the preparation of quantum wires of silicon by means of a chemical attack method carried out on silicon that has been doped such that it conducts electricity substantially via the effective transport of electric charge by means of so-called holes. The microporous crystalline silicon thus produced is in the form of a discrete mass having a bulk-like, interconnected crystalline silicon structure of quantum wires whose band-gap is greater than normal crystalline silicon. Because of this increased band-gap this microporous crystalline silicon may be used as an active element in applications such as tandem solar cells.

6 Claims, 2 Drawing Sheets

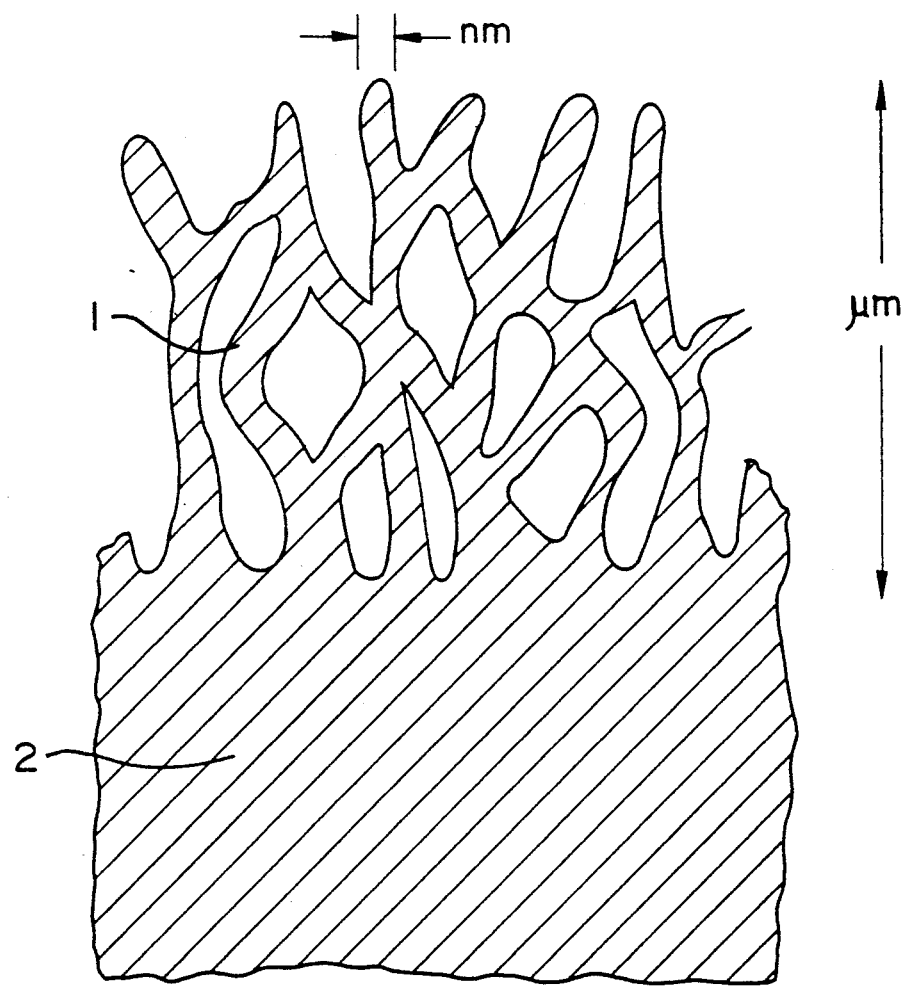
FIG. 1
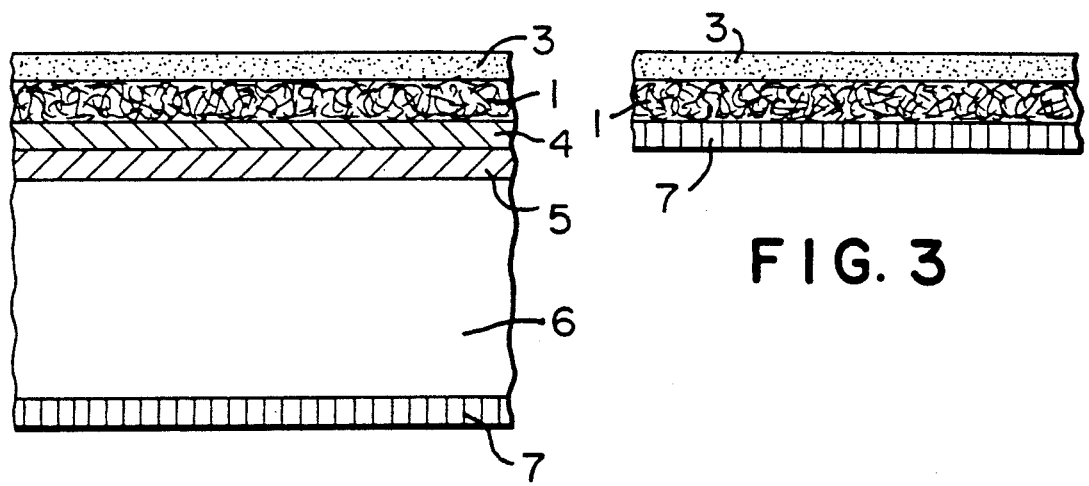
FIG. 2
FIG. 3

MICROPOROUS CRYSTALLINE SILICON OF INCREASED BAND-GAP FOR SEMICONDUCTOR APPLICATIONS

BACKGROUND OF THE INVENTION

1. Field of the Invention

This invention relates generally to semiconducting crystalline silicon and more particularly to the increase in the band gap of this material which can be produced by the treatment of normal crystalline silicon under very special processing conditions.

2. Description of the Prior Art

Crystalline semiconductor silicon has long been known, as has the chemical etching of this material, including the chemical etching of crystalline silicon so as to produce a material possessing a substantial porosity. Crystalline semiconductor silicon has always been considered to possess an electronic band gap of approximately one electron volt in width and this band-gap is often reported as 1.01 electron volts. However, it is also known that so-called hydrogenated amorphous silicon can have a band-gap which is wider than one electron volt and can even be as high as 1.3 electron volts. Such hydrogenated amorphous silicon is not crystalline, however, and therefore lacks many of the properties of crystalline silicon. Hydrogenated amorphous silicon can be produced by the glow discharge decomposition of silane or by the evaporation of silicon through a glow discharge containing hydrogen. However, bulk-like, interconnected porous crystalline silicon having a band-gap significantly above 1.01 electron volts has not previously been known and no method of producing it has previously been known.

SUMMARY OF THE INVENTION

If doped crystalline silicon is exposed to hydrofluoric acid solution under anodic bias it is found that porous silicon may be produced. It is further found that under particular conditions of concentration, anodic bias, and silicon doping that the porous silicon thus produced will be in the form of what may be termed a bulk-like, interconnected crystalline silicon quantum wire structure whose band-gap is found to be increased substantially above that of normal crystalline silicon. Additionally this porous silicon may be separated from the substrate on which it is produced to form a discrete mass of bulk-like, interconnected crystalline silicon quantum wires.

DESCRIPTION OF THE DRAWINGS

FIG. 1 is a schematic representation of a microporous crystalline silicon (1) that has been produced on the surface of non-degerated p-type crystalline silicon (2) showing its interconnected bulk-like quantum wire structure.

FIG. 2 is a schematic representation of a tandem solar cell in which microporous crystalline silicon (1) is used as one part of the tandem solar cell wherein the microporous crystalline silicon (1) has a front, conductive semitransparent film (3) of metal such as platinum which acts as a Schottky barrier and is in electrical contact with a transparent tin oxide layer (4), which in turn lies upon a normal p/n junction solar cell which includes a n-type layer (5) and a p-type layer (6). crystalline silicon (1) is used as an active semiconductor layer. The microporous crystalline silicon (1) is contacted from above by a layer of semitransparent metal (3) such as platinum which acts as a Schottky barrier, and the microporous silicon (1) is electrically contacted from below by a conducting substrate (8).

DETAILED DESCRIPTION OF THE INVENTION

Figure 4:
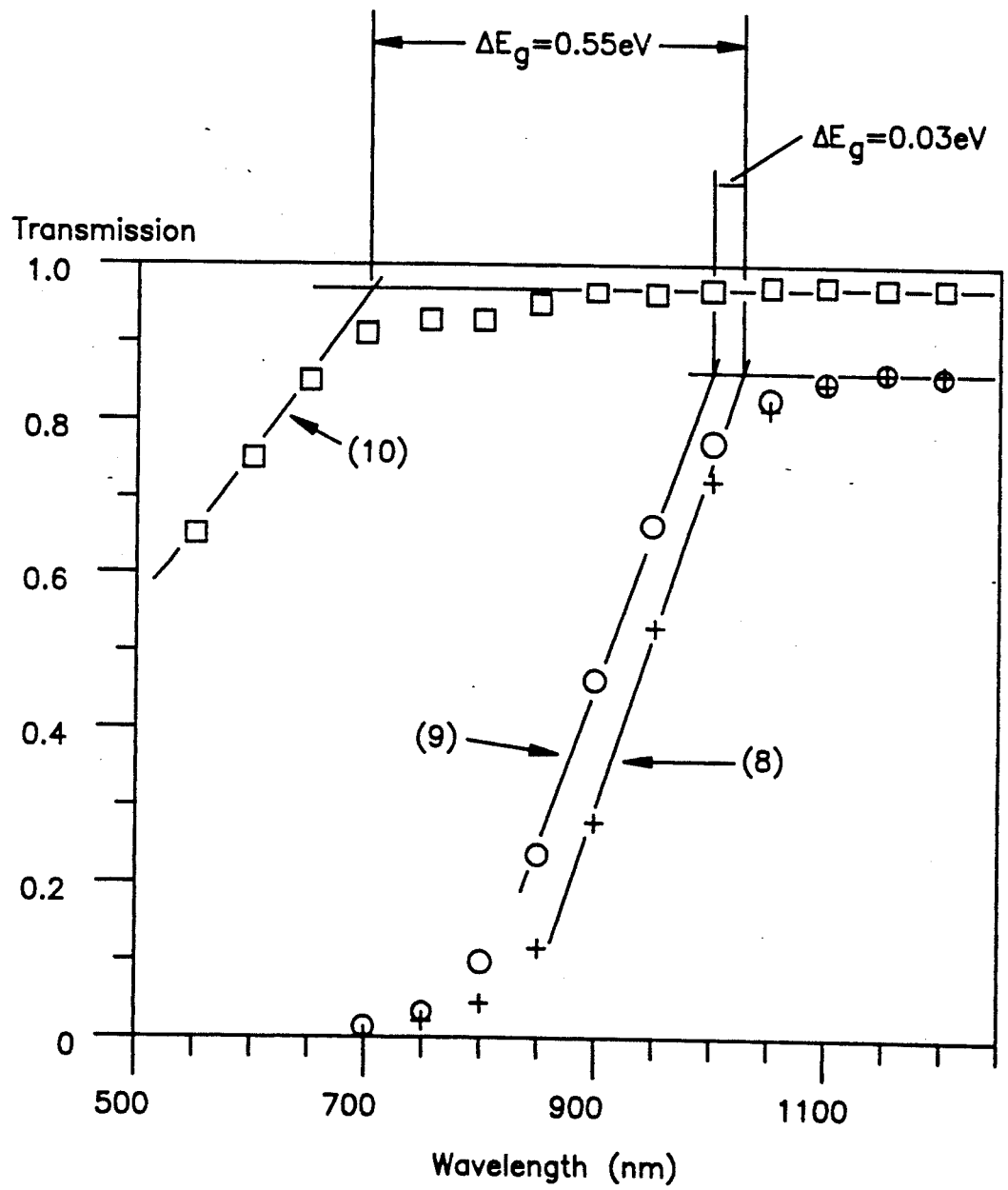
FIG. 4. Measured transmission for normal crystalline silicon (8), for microporous crystalline silicon produced using a degenerated p-type silicon substrate (9), and for microporous crystalline silicon produced using a non-degenerated p-type silicon substrate (10).

The formation of porous silicon layers on silicon electrodes in hydrofluoric acid has long been known. Indeed, the use of such layers to form fully isolated oxidized porous silicon (FIPOS) as an insulating medium for integrated circuit uses is widely practiced in industry. Furthermore, the etching of silicon for a variety of purposes, including surface preparation, is also widely known as in the electropolishing of silicon. We have now discovered that under an anodic bias, a bulk-like, interconnected quantum structure form of silicon is produced when the reaction is limited by the charge supply of the electrode and not by ionic diffusion in the electrolyte. Because the electronegativity of hydrogen, H, is close to that of silicon provided no electronic holes are present, a silicon surface that is covered with hydrogen will be inert to further attack by fluoride ions. In such a case, if an electronic hole reaches the surface it will nucleate attack on silicon-hydrogen bonds and allow Si-F bonds to be established. Due to the polarizing influence of the bonded F, another fluoride-ion bonding to silicon can occur with the generation of a hydrogen molecule, $H_2$, and the injection of one electron into the electrode. Due then to the polarization of the Si-F groups we have discovered that the electron density of the Si-Si backbonds will be lowered such that these weakened bonds can now be attacked by HF or even $H_2O$ while the surface silicon atoms still remain bonded to hydrogen. The change in surface geometry produced by this attack will change the electric field distribution in such a way that electronic hole transfer occurs at the attack location preferentially, leading to selective attack at the site of the initial attack. Therefore, surface inhomogeneities are amplified. Furthermore, if the walls between successive pores are depleted in electronic holes they will be protected from further dissolution. Such a depletion of holes occurs where the p-type silicon material between the pores becomes so thin that a quantum confinement effect of the charge carriers occurs. If the remaining silicon structure is described in terms of interconnected silicon, the interconnected rods produced by the quantum confinement effect are a quantum structure and may be termed quantum wires, even though they are interconnected. The thinner the wires get, the larger the band gap will become and thus the fewer holes will be available for further etching reaction. In such a case we have discovered that the etching process involving the formation of quantum wires is self-limiting when the chemical attach is limited by the charge supply from the semiconducting non-degenerated p-type silicon. In this way the chemical attack becomes self limiting as the attack proceeds due the increase in the band-gap of the interconnected bulk-like quantum structure of the crystalline silicon which occurs as the physical dimension of the said interconnected bulk-like quantum structure decreases to less than about 100 Angstroms.

PREFERRED EMBODIMENTS OF THE INVENTION

In a first preferred embodiment of the present invention the electrolyte used consists essentially of one part of ethanol together with one part of hydrofluoric acid, the ethanol consisting essentially of ethanol which itself contains approximately 2% of water and the hydrofluoric acid consists essentially of 48% of HF and 52% of water. It has been surprisingly found that if a crystalline silicon substrate that is boron-doped such that is has a resistivity of about 5 ohm-cm is anodically biased in this electrolyte with an applied anodic current of 55 mA/cm² for about 45 minutes, then a porous silicon layer in the form of a discrete mass of bulk-like, interconnected crystalline silicon is formed upon the surface of the silicon. It has now been discovered that in order to form the porous silicon it is necessary to maintain the current density whose numerical value, when measured in milliamperes per square centimeter such that this current density is less than three times the numerical value of the concentration of hydrofluoric acid, HF, that is present in the electrolyte when this concentration is measured in weight percent. Furthermore, it has been discovered that if the electrolyte is diluted to have a concentration of 1 wt. % aqueous HF and is electropolished for about 10 seconds at a current density of 100 mA/cm² then the porous silicon layer can then the easily removed from the crystalline silicon substrate upon which it was formed. The electropolishing step to release the bulk-like, interconnected mass of crystalline silicon having a quantum structure of interconnected quantum wires may be carried out in a hydrofluoric acid solution containing less than 10% of hydrofluoric acid using a high anodic current. It has now been discovered that in order to release the porous silicon from the substrate it is necessary to electropolish this sample using a current density whose numerical value, when measured in milliamperes per square centimeter, is at least ten times the numerical value of the concentration of hydrofluoric acid, HF, that is present in the electrolyte when this concentration is measured in weight percent.

Although in the present instance the silicon used had a resistivity of 5 ohm-centimeters, the resistivity of the non-degenerated p-type silicon may vary from 0.1 to 30,000 ohm-centimeters and the invention as disclosed here may still be successfully practiced.

With the assumption of a regular triangular array pattern of channels perpendicular to the surface, the minimum wall thickness between channels between walls can be calculated from the measured density of the microporous silicon together with that solid, bulk, crystalline silicon to give a value for the diameter, q, of the silicon "rods" between the channels of between 6 and 6.6 nanometers. This value is within the expected value for tunneling effects to occur. Thus, the regions between the etched pores or channels may be considered as quantum wires of silicon. However, these quantum wires will be interconnected such that the microporous crystalline silicon thus produced is in the form of a discrete mass of bulk-like, interconnected crystalline silicon. In the approximation that these wires have a square cross-section of side length q, the change in in energy gap, $\Delta E$, may be calculated from the following, if the silicon wire side lengths are on the order of 50 Angstroms or below:

$$\Delta E = h^2/(4m^*q^2)$$

where h is Planck's constant and m* denotes the effective hole or electron mass, $m_h^*$ or $m_v^*$, respectively, for the change, $\Delta E_v$ (the change in energy of the valence band), or $\Delta E_c$ (the change in energy of the conduction band).

Further etching, that is, chemical attack decreases the wire side lengths and increases the increase in band-gap until no further etching occurs due to the depletion of holes. It is thus a self limiting process. The chemical attack becomes self-limiting as the electrochemical attack proceeds due to the increase in the band-gap which occurs as the physical dimension of the said bulk-like quantum structure decreases to less than about 100 Angstroms.

For a given range of quantum wire diameters that have been produced, from 2.1 nanometers to 6.6 nanometers, an increase in the band gap ($\Delta E_v + \Delta E_c$) of approximately 0.3 to 3.2 electron volts results. This change in band-gap gives an easily measurable change in light absorbing characteristics of the material. We have measured the transmission curve obtained for a 110 nanometer thick porous silicon film produced on a non-degenerate p-type substrate and have found that this absorption curve corresponds to an increase in the energy gap of 550 millielectron-volts (0.55 electron volts) which correlates with a quantum wire diameter of about 2 nanometers or a pore diameter, d, of about 5 nanometers (for 60% porosity). Similarly, the increase in the energy-gap found for a porous silicon layer produced on a degenerate silicon sample, whose resistivity is less than 0.01 ohm-centimeters is found to correspond to about 30 millielectron-volts (0.030 electron-volts), corresponding to quantum wires of q=9 nanometers and pores of d=9 to 18 nanometers (for 30 to 50% porosity), which is in agreement with the d-values observed by transmission electron microscopy. Thirty millielectron volts is a small increase but thirty millielectron-volts or greater is considered to be significantly greater than the 1.01 electron volts that is the usually reported band-gap of normal, crystalline silicon. Thus, we have discovered that by special, etching and doping conditions that porous silicon that is composed of effective quantum wires of crystalline silicon can be produced and that the band-gap of this porous crystalline silicon thus produced can be significantly increased relative to that of normal crystalline silicon.

In a second preferred embodiment a substrate of regular crystalline silicon is fabricated into a normal p/n junction solar cell by standard methods, after which a thin layer, of transparent, electrically conductive tin oxide is applied to this p/n junction solar cell by sputtering or other means to produce a transparent, electrically conductive layer attached to and in electrical contact with the p/n junction solar cell. A thin layer of p-type polycrystalline silicon is then applied to this tin oxide coating by chemical vapor decomposition, sputtering, or other means. After this polycrystalline layer has been formed, this polycrystalline layer is exposed to concentrated hydrofluoric acid under anodic bias produced by an applied current density to convert this top polycrystalline layer to a top layer which consists of a discrete mass of bulk-like, interconnected crystalline silicon of increased band gap that is attached to and in electrical contact with the transparent, electrically conductive tin oxide. To this bulk-like, interconnected crystalline silicon of increased band-gap is then applied a front, conductive semitransparent thin film coating of platinum to form a Schottky barrier solar cell with the bulk-like interconnected crystalline silicon of increased band gap. In this way a tandem solar cell is formed which comprises a front cell using bulk-like, interconnected crystalline silicon which has a band gap of about 1.5 electron volts and a back cell of normal p/n junction solar cell configuration which has a band gap of about one electron volt. Such a tandem solar cell can have an efficiency which far exceeds that of the original p/n junction solar cell made with normal silicon, and such a tandem solar cell can have an efficiency which is nearly 50%.

If the layer of polycrystalline silicon were produced upon an electrically conducting substrate and the electrically conducting substrate were not transparent then a solar cell could still be made by the deposition of a Schottky barrier onto the bulk-like, interconnected crystalline silicon of increased band-gap that can itself be produced from this polycrystalline silicon by chemical attack by the new method that we have now invented. In such a case a normal Schottky barrier solar cell would be produced and not a tandem solar cell.

Although we have discussed a new tandem solar cell, the bulk-like interconnected crystalline silicon may be used to form other types of semiconductor devices in active semiconductor applications as well, especially light emitting diodes.

The structure of microcrystalline porous silicon is illustrated in FIG. 1, which shows the bulk-like, interconnected quantum wire structure of this material, while FIG. 4 shows the dependence of the light transmission of this microporous crystalline silicon when formed using a degenerated crystalline silicon substrate (9), and when formed using a nondegenerated p-type silicon substrate (10). Also shown in FIG. 4 is the light transmission of normal crystalline silicon. As indicated in FIG. 4, the band-gap of the microporous crystalline silicon when formed using a non-degenerated crystalline silicon substrate is 0.55 electron-volts (eV) greater than that of normal crystalline silicon while that of microporous crystalline silicon made using a degenerated crystalline silicon substrate is only 0.03 electron volts (eV) greater than that of normal crystalline silicon. FIG. 2 shows for reference the structure of a tandem solar cell as disclosed in this invention while FIG. 3 shows the structure of a solar cell based upon the formation of a Schottky barrier on microporous crystalline silicon.

We claim:

1. Microporous crystalline silicon for use in active semiconductor applications, wherein said microporous crystalline silicon is produced on a surface of normal semiconducting non-degenerated p-type crystalline silicon, said microporous crystalline silicon consisting essentially of an interconnected bulk-like quantum wire structure, said bulk-like quantum wire having a side length, and said interconnected bulk-like quantum wire structure having an increased band-gap being produced through a process of chemical attack, said chemical attack being carried out on a non-degenerated p-type silicon substrate, said non-degenerated p-type silicon substrate having a resistivity between 0.1 and 30,000 ohm-centimeters and said chemical attack being carried out under an anodic bias such that said chemical attack is limited by charge supply from the semiconducting non-degenerated p-type crystalline silicon, wherein said chemical attack becomes self-limiting as said attack proceeds due to an increase in the band-gap of said interconnected bulk-like quantum wire structure which occurs as said side length decreases to less than 100 Angstroms wherein said chemical attack which is carried out under an anodic bias is carried out in an electrolyte that contains a concentration of hydrofluoric acid wherein said anodic bias is produced by an applied current density whose numerical value, when measured in milliamperes per square centimeter is such that this current density is less than three times the numerical value of said concentration of hydrofluoric acid present in said electrolyte when said concentration is measured in weight percent.

2. Microporous crystalline silicon for use in active semiconductor applications as described in claim 1 wherein said microporous crystalline silicon of increased band-gap has a band-gap at least 30 millielectron-volts greater than 1.01 electron volts.

3. Microporous crystalline silicon for use in active semiconductor applications as described in claim 2, wherein said active semiconductor applications further comprise a solar cell.

4. Microporous crystalline silicon for use in active semiconductor applications as described in claim 3, wherein said solar cell is a tandem solar cell.

5. Microporous crystalline silicon for use in active semiconductor applications as described in claim 4 wherein said tandem solar cell consists essentially of a top layer, said top layer consisting essentially of said interconnected bulk-like quantum structure of crystalline silicon of increased band-gap upon which a front, conductive, semitransparent thin film coating has been applied, said interconnected bulk-like quantum structure of microporous crystalline silicon of increased band-gap itself adhering to and being electrically connected with a thin, transparent, electrically conducting film, said thin, transparent, electrically conducting film itself being attached to and electrically connected with a back layer which consists essentially of a substrate that consists essentially of a p/n junction solar cell.

6. Microporous crystalline silicon for use in active semiconductor applications as described in claim 5 wherein said p/n junction solar cell is a silicon solar cell.

* * * * *

Adverse Decisions In Interference

Patent No. 5,206,523, Ulrich M. Gosele, Volker E. Lehman, MICROPOROUS CRYSTALLINE SILICON OF INCREASED BAND-GAP FOR SEMICONDUCTOR APPLICATIONS, Interference No. 103,954, final judgment adverse to the patentees rendered September 30, 1999, as to claims 1-6.
*(Official Gazette February 15, 2000)*